United States Patent [19]

Buchmann et al.

[11] Patent Number: 4,732,871

[45] Date of Patent: Mar. 22, 1988

[54] PROCESS FOR PRODUCING UNDERCUT DUMMY GATE MASK PROFILES FOR MESFETS

[75] Inventors: Peter L. Buchmann, Langnau a.Albis; Volker Graf, Wollerau, both of Switzerland; Peter D. Hoh, Stormville, N.Y.; Theodor O. Mohr, Wettswil; Peter Vettiger, Langnau a.Albis, both of Switzerland

[73] Assignee: International Business Machines Corporation, Armonk, N.Y.

[21] Appl. No.: 31,648

[22] Filed: Mar. 30, 1987

[30] Foreign Application Priority Data

Jul. 11, 1986 [EP] European Pat. Off. ........ 86109500.8

[51] Int. Cl.$^4$ .......................................... H01L 21/265
[52] U.S. Cl. ..................................... 437/41; 437/176; 156/633
[58] Field of Search .................... 437/41, 176; 156/633

[56] References Cited

U.S. PATENT DOCUMENTS

| | | | |
|---|---|---|---|
| 3,639,186 | 2/1972 | Forster et al. | 156/17 |
| 4,503,599 | 3/1985 | Veyanagi et al. | 437/22 |
| 4,519,127 | 5/1985 | Arai | 437/30 |
| 4,532,004 | 7/1985 | Akiyama et al. | 437/22 |
| 4,561,169 | 12/1985 | Miyazaki et al. | 437/29 |
| 4,642,879 | 2/1987 | Kawata et al. | 437/22 |

OTHER PUBLICATIONS

Marmillion et al., IBM Technical Disclosure Bulletin, "High Temperature Lift-Off Structure", vol. 26, No. 12, May 1984, pp. 6506 and 6507.
Lignieres et al., IBM Technical Disclosure Bulletin, "Method for Characterizing the Si$_3$N$_4$ Dry Etch Process", vol. 21, No. 9, Feb. 1979, p. 3654.
Yamasaki et al., IEEE Transactions on Electron Devices, vol. ED-29, No. 11, Nov. 1982, pp. 1772–1777, "GaAs LSI-Directed MESFET's with Self-Aligned Implantation for n+-Layer Technology (SAINT)".
"Self-Align Implantation for n+ Layer Technology (SAINT) for High-Speed GaAsIcs", Electronics Letters, 4th Feb. 1982, vol. 18, No. 3, pp. 119–121.
"GaAs/(GaAl) As Heterojunction Bipolar Transistors Using a Self-Aligned Substitutional Emitter Process", IEEE Electron Device Letters, Vol. EDL-7, No. 1, Jan. 1986, pp. 8–10.
Hinkel et al., IBM Technical Disclosure Bulletin, "Method of Influencing the Etch Rate of PECVD Films and Applications of the Method", vol. 24, No. 11B, Apr. 1982, p. 6094.

Primary Examiner—George T. Ozaki
Attorney, Agent, or Firm—Thomas J. Kilgannon

[57] ABSTRACT

Process for producing temperature-stable undercut profiles for use in semiconductor fabrication. The process is based on the phenomenon of high etch-rate selectivity between RF- and LF- PECVD-grown silicon nitride films (12G and 13G, respectively) that are deposited on top of each other. By choosing proper film and process parameters, these PECVD nitride structures can be made stress-free: the tensile stress of the RF film (12G) compensates the compressive stress of the LF film (13G).

Also disclosed is an application of a T-shaped structure (15), produced with the new process, in a method for fabricating fully self-aligned "dummy" gate sub-micron MESFETs.

28 Claims, 18 Drawing Figures

PROCESS FOR PRODUCING UNDERCUT DUMMY GATE MASK PROFILES FOR MESFETS

BACKGROUND OF THE INVENTION

1. Field of the Invention

The invention relates to a process for producing undercut mask profiles for use in semiconductor manufacturing and to an application of the process in the fabrication of field effect transistors where the process permits self-alignment of all three important device parts, namely the implanted contact regions, the ohmic- and the gate-metallizations, with respect to each other.

There has been a dramatic increase in the use of integrated circuits over the last decade which resulted in an increasing demand for smaller device dimensions. A number of methods are known to increase the integration density of integrated circuits. By using electron and X-ray exposure methods instead of the hitherto used light radiation, progress was made in the direction of a higher resolution. There were, furthermore, efforts to reach very narrow line widths in the range of 1 μm and less by extending conventional lithographic processes thereby avoiding the cost-intensive techniques of electron and X-ray lithography. With the technique of plasma or reactive ion etching for etching metals, semiconductors and dielectric materials, further developments took place in the direction of very narrow line widths and consequently toward improved device performance.

One approach, by which sub-micron resolution can be achieved, makes use of underetching techniques to obtain undercut structures serving as masks in subsequent process steps. These undercut structures, often T-shaped, are used to define very small, sub-micron lateral device dimensions. Basically, the lateral undercut dimensions are transferred to the underlying semiconductor surface by using non-isotropic processes to project the "top" of the T-profile, and by using isotropic processes to project the "foot" of the T.

A great variety of materials and methods have been utilized or suggested for the formation of such undercut structures. Most commonly, different materials are used for the "top" and for the "foot" of the T, respectively. A material combination often described is silicon nitride ($Si_3N_4$) - silicon dioxide ($SiO_2$).

Multi-layer photoresist structures, the layers consisting of different resists, have also been proposed in the literature, e.g., in the article "Self-Align Implantation for n+-Layer Technology (SAINT) for High-Speed GaAs ICs" (Electronics Letters, February 1982, Vol. 18, No. 3, pp. 119-121). A similar approach has been described in the article "GaAs/(GaAl)As Heterojunction Bipolar Transistors Using a Self-Aligned Substitutional Emitter Process" (IEEE Electron Device Letters, Vol. EDL-7, No. 1, January 1986).

These photoresist methods, however, face the drawback that the resulting undercut structures are not stable at the elevated temperatures of subsequent annealing or alloying steps in the semiconductor device fabrication process.

There have also been proposals for techniques aimed at a reduction of the number of steps needed to produce the undercut structures. In these proposals, the etch rate of a single material is varied either during deposition or it is influenced by the neighborhood of other materials. Such single-material techniques are described in the following references:

"Method of Influencing the Etch-Rate of PECVD Films and Applications of the Method" (IBM Technical Disclosure Bulletin, Vol. 24, No. 11B, April 1982, p. 6094). According to the described method, the etch-rate of PECVD films formed by hydrogen-containing compounds is decreased by ion irradiation. It is suggested that, by selective irradiation, the method can be used to form patterned films without using a mask.

"High Temperature Lift-Off Structure" (IBM Technical Disclosure Bulletin, Vol. 26, No. 12, May 1984, pp. 6506-6507). Here, a recursive lift-off profile is obtained by varying the composition of a silicon nitride layer throughout the layer thickness so that a varying etch-rate is obtained for isotropic plasma etching. The change in composition is obtained by changing the temperature during the deposition process.

"Method for Characterizing the $Si_3N_4$ Dry Etch Process" (IBM Technical Disclosure Bulletin, Vol. 21, No. 9, February 1979, p. 3654). The described method is based on the discovery that the etch-rate of $SiO_2$ is increased in the immediate vicinity of an applied top $Si_3N_4$ layer whereas the etch-rate in the more distant $SiO_2$ remains unaffected. An etch-rate ratio of 3 is reported.

U.S. Pat. No. 3,639,186 discloses a process for the fabrication of high resolution pattern. An undercut is obtained in a $SiO_2$ layer by using the effect that the etch-rate of the $SiO_2$ is increased in the vicinity of Si which could, as in the described example, be the substrate material on which the pattern is to be formed.

Although these single-material methods require fewer process steps than required for multi-material mask profiles, there are concerns since the processes require complex tools (with selective ion irradiation), are time consuming (when the temperature is changed) or cause severe restrictions as to the materials that can be used (when relying on "neighborhood" effects).

The above cited references are representative of the present state of the art in undercut structure techniques. They disclose a wide variety of processes for forming undercut profiles but they do not disclose or suggest the basic concept underlying the present invention, i.e., the use of different plasma excitation frequencies to obtain different etch-rates.

This novel process for forming undercut structures is a prerequisite for the new method of the fabricating fully self-aligned Field Effect Transistor (FET) structures also described herein.

A variety of FET structures and processes for their fabrication have already been proposed, among others there are those for metal-semiconductor field effect transistors (MESFET) using GaAs. Basically, there are two types of processes for the fabrication of self-aligned GaAs MESFETs: one type of process uses a refractory gate metal as mask for the implantation of the ohmic contact regions, the other type of process uses a "dummy" gate as mask for the contact implant, the dummy gate being replaced by a Schottky gate after ohmic contact metal deposition and alloying.

Refractory gate structures and processes have the advantage of process simplicity. They allow the fabrication of a simple FET structure with a relatively small number of lithographic steps. The prime concern with this process however is the stability of the metal-semiconductor interface on annealing. Since the gate deposition takes place prior to the ohmic contact region implant, the Schottky barrier at the gate-channel interface is exposed to high temperature cycles required to electrically activate the implanted material and to alloy the ohmic contacts. During these high-temperature processes the metal-semiconductor interface changes due to interdiffusion, lateral diffusion, stress, shrinkage, etc. This affects the Schottky barrier height and the threshold voltage of the transistor. Dummy gate structures and processes have been proposed by K. Yamasaki et al. in articles "GaAs LSI-Directed MESFET's with Self-Aligned Implantation for n+-Layer Technology (SAINT)" (IEEE Trans., ED-29, No. 11 pp. 1772–1777 (Nov. 1982)) and "Self-Align Implantation for n+-Layer Technology (SAINT). for High-Speed GaAs ICs" (Electronics Letters, Vol. 18, pp. 119–121, (1982)). The use of a dummy gate makes the fabrication process for MESFET's more complicated compared to the refractory-gate process, however, it offers a number of advantages:

The metal-semiconductor interface is not exposed to a high-temperature cycle and therefore is not distorted since the actual gate metal deposition is done after the contact region implant anneal process.

There is more freedom in the choice of the gate material. The requirements are determined by the final process steps such as chip mounting, packaging, etc., which are significantly less stringent than with the high-temperature implant anneal.

The sequence of process steps permits FET channel measurements (between ohmic contacts) and characterization prior to gate metal deposition, i.e., a final adjustment of the channel threshold can be achieved before device completion, e.g., by channel recessing, thereby improving the yield.

The gate metal can be used as the first-level wiring.

The SAINT process referred to above uses a multi-layer dummy gate mask consisting of different photoresists. The photoresist mask can serve as mask for the implantation of the n+-contact regions but does not withstand the high temperature of the following annealing step. As a result, the gate metallization and the ohmic metallization are not self-aligned with respect to the implanted contact regions. Truly self-aligned metallizations are, however, highly desirable to keep parasitic effects, in particular n+ layer series resistances, small.

A fully self-aligned MESFET fabrication process has been described in co-pending European patent application No. 85.115572.1. In that process, a multi-layer "inverted T" profile is used as mask for the n+-implant and for the ohmic- and gate-metallizations. The upper part of the inverted T is the dummy gate which is replaced by the Schottky gate after ohmic contact metal deposition. The source-gate and drain-gate separations are determined by the difference in width of the upper and lower parts of the inverted T.

The main concern regarding this process is its complexity, particularly the opening of the via hole for the gate definition becomes very critical for sub-micron device dimensions.

It is a main object of the present invention to extend the use of conventional lithographic processes to dimensions in the sub-micron range by utilizing underetch techniques to produce undercut mask profiles.

Another object is to provide a process for producing undercut mask profiles that are temperature stable and that can be obtained using conventional, easy-to-control process steps.

A further object is to provide a field effect transistor fabrication process which allows self-alignment of all critical device parts, namely the gate and ohmic contact metallizations and the implanted contact regions, with respect to each other.

The invention as claimed is intended to meet the above objectives and to remedy the drawbacks encountered with hitherto known processes. It provides a temperature-stable undercut mask structure obtained by underetching a nitride structure in which etch-ratio variations in the order of 1:20 are obtained by changing the plasma excitation frequency of the PECVD process that is used to grow the nitride structure. The invention also solves the complexity problem in the fabrication of fully self-aligned FET devices in that the temperature-stable mask provided by the invention substantially simplifies the mask-profile transfer onto the semiconductor surface where the FET device is to be formed.

The advantages offered by the inventive process are mainly that it requires fewer and less critical process steps. Providing the same resolution and reproducibility as obtainable with the best known processes, the new process permits a substantial reduction in process complexity, tooling needs and processing time, thus resulting in substantial cost savings.

The invention is described in detail below with reference to drawings which illustrate specific embodiments and in which

FIGS. 5A–5M are illustrations of the steps of the process used to fabricate the structure shown in FIG. 4.

The inventive underetch process makes use of a phenomenon which was observed and verified by the inventors: silicon nitrides (such as $SiN_x$ and $SiO_xN_y$) deposited at a low plasma excitation frequency (LF) in a plasma-enhanced chemical vapor deposition (PECVD) tool have a substantially lower etch-rate for wet chemical etch or dry plasma etch processes than nitride deposited at higher excitation frequencies (RF). Etch-rate ratios of 1:20 have been obtained.

It has also been found that $SiN_x$ films, deposited under normal RF deposition conditions, are under high tensile stress whereas $SiN_x$ films deposited at LF have compressive stress. By adjusting the thickness of the $SiN_x$ films that are deposited on top of each other or by varying process parameters like frequency, flow or energy, stress-free films can be produced. This turns out to be important whenever $SiN_x$ profiles are used in fabrication processes involving elevated temperature process steps.

The exact physical explanation for these phenomena is lacking but it is reasonable to assume that the variations in etch-rate and stress are related to the same effect—it is likely that the amount of contaminants incorporated in the films, like hydrogen, is responsible. It is, therefore, expected that the same effects can be obtained for further materials having a high hydrogen concentration when deposited in a RF PECVD process and where a reduction in frequency would reduce the hydrogen concentration. Other nitrides, such as boron nitride ($BN_x$) will qualify; possibly also silicon (Si), polycrystalline and amorphous, tungsten silicide ($WSi_x$), silicon carbide ($SiC_x$), and others.

These particular material and process characteristics form the basis for the present invention: the nitride undercut profiles are temperature-stable, the undercut and thus the sub-micron dimensions can be accurately controlled, and the profiles can be made stress-free. From a practical point of view, the production of two nitride layers having selective etch-rates is very simply accomplished in the same PECVD tool by merely switching from one frequency generator to another, e.g., from RF to LF, and by simultaneously changing the gas composition, e.g., by turning the valves that control the gas flow.

Figure 1A:
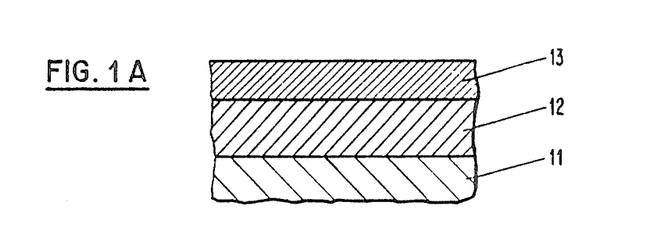
FIGS. 1A–1C are illustrations of the steps of the inventive process used to produce a T-shaped undercut mask profile.
Figure 1B:
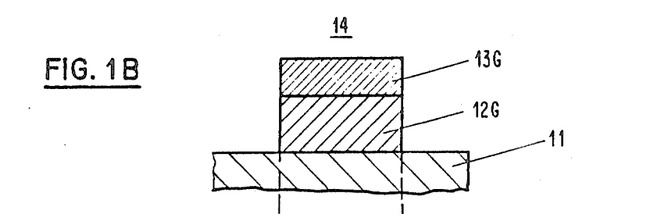
Figure 1C:
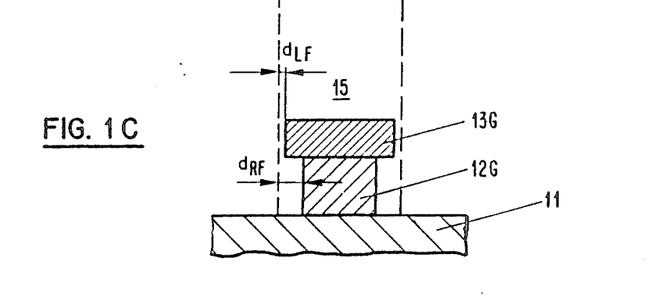

Referring now to the drawings and first to FIGS. 1A to 1C thereof, there are illustrated the successive steps of the process used to produce an undercut mask profile in accordance with the present invention. In the example chosen, a T-shaped profile 15 (in FIG. 1C) is obtained.

The process is initiated starting from a semiconductor substrate 11 on which the mask profile is to be formed (FIG. 1A). In a first step, a first nitride layer 12 is deposited using a PECVD process with a first plasma excitation frequency RF of 13 MHz. With a substrate temperature of 300° C., a pressure of about 0.1 Pa, a power of 75 W, and a gas composition $NH_3$: $N_2$:$SiH_4$ (18:3:55), a $Si_3N_4$ layer is deposited at a rate of 20 to 30 nm/min. The thickness of the layer 12 is chosen to be 400 nm.

In a next step, a second nitride layer 13 is deposited using the same PECVD tool, not changing the substrate temperature or the pressure. The plasma excitation frequency is switched from RF (13 MHz) to LF, in the example 50 kHz. At the same time, the ammonia ($NH_3$) supply is cut-off, the $N_2$ and $SiH_4$ flow slightly changed from 3 to 4 and 55 to 50, respectively. The now deposited $Si_3N_4$ film, again at 20 to 30 nm/min., is made 300 nm thick. After deposition of this LF layer 13, the structure shown in FIG. 1A is obtained. The etch-rate of that second $Si_3N_4$ layer 13 is lower by a factor of 20 than that of the first $Si_3N_4$ layer.

In a next step, illustrated in FIG. 1B, the structure 14 is obtained by patterning layers 12 and 13. Any suitable anisotropic process, such as photoresist lithography followed by a reactive ion etch (RIE) process, can be used.

Subsequently, the T-shaped undercut profile 15 shown in FIG. 1C is obtained in a wet chemical etch process. Dry plasma etching could also be used. Since the RF layer 12G has an etch-rate that is about 20 times higher than that of LF layer 13G, the undercut is obtained with $d_{RF} \approx 20 \times d_{LF}$. The undercut is proportional to the etch time and is easily controlled with great accuracy as will become apparent from the diagram shown in FIG. 3. In producing the T-structure 15 for high precision manufacturing, the very small but possibly not negligible etching ($d_{LF}$) of layer 13G may have to be taken in account by allowing a so-called "etch-bias" when patterning structure 14.

Figure 2:
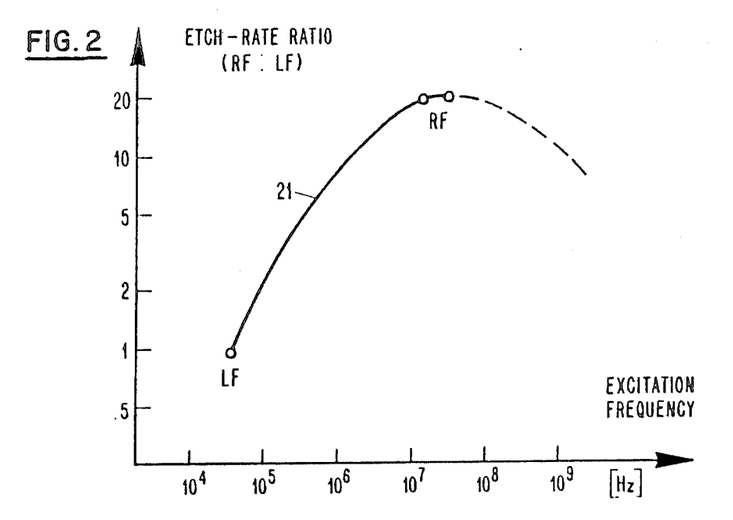
FIG. 2 is a diagram, illustrating, for the inventive underetch process, the relationship between the PECVD plasma excitation frequency and the resulting nitride etch-rate.

The diagram of FIG. 2 illustrates, for the above described process, the relationship between the plasma excitation frequency and the resulting etch-rate for $Si_3N_4$. Curve 21 was drawn from measured values (indicated by small circles). The etch-rate of $Si_3N_4$ deposited at low (LF) frequencies is substantially lower—by a factor of 20—than that of material deposited at RF frequencies. The etch-rates for frequencies above $10^8$ Hz have not been measured but a decrease towards higher frequencies is expected as indicated by the dotted continuation of curve 21. From the diagram, it is apparent, that the desired difference in etch-rate can be obtained by using LF frequencies below 100 kHz and RF frequencies in the 1 to 100 MHz range.

The diagram of FIG. 3 illustrates, again for the above described process, the linear relationship between the etch time and the resulting etch depth for $Si_3N_4$.

Figure 3:
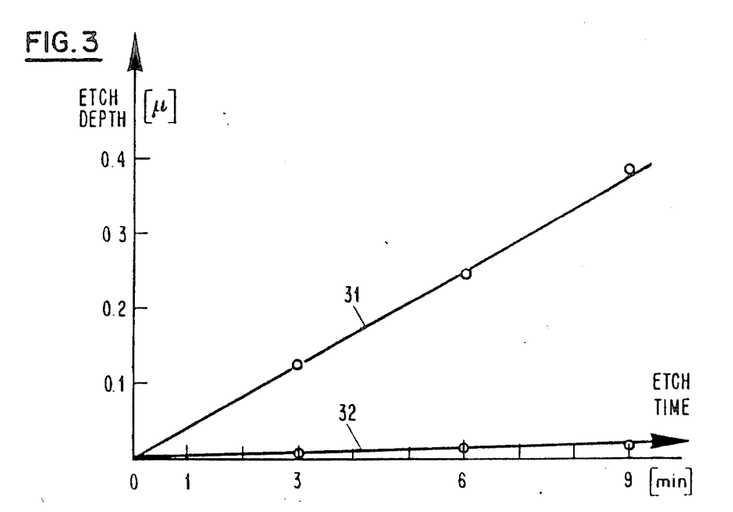
FIG. 3 is a diagram, illustrating, for the inventive underetch process, the linear relationship between the etch time and the resulting etch depth or undercut.

Lines 31 and 32, for RF and LF $Si_3N_4$ layers, respectively, were drawn from values (o) measured in a buffered hydrofluoric acid (BHF) wet chemical etch process. The diagram shows that the high difference in etch depth per time unit and the linear time dependency of the etch-rate provide a process that can be simply controlled with great accuracy.

Figure 4:
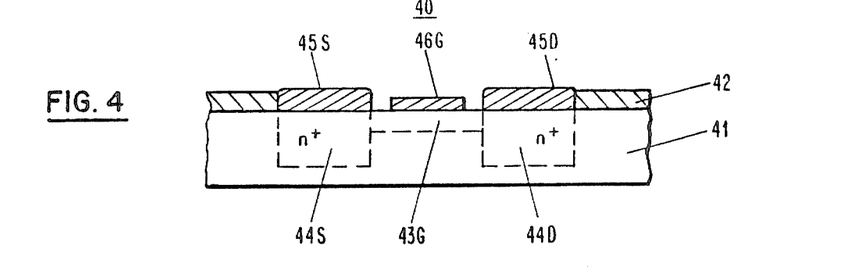
FIG. 4 is a cross-sectional representation of a sub-micron FET produced with a fabrication method that uses the inventive underetch process.

In FIG. 4, there is shown an embodiment of a metal-semiconductor FET (MESFET) produced using the underetch process of the present invention. The MESFET 40 is formed on a semi-insulating GaAs substrate 41. The self-aligned device 40 comprises a relatively shallow channel 43G, its doping concentration (resulting in either a $n^-$- or n-channel) depends on the desired value of the threshold voltage $V_{th}$, i.e., whether enhancement-type (E) or depletion-type (D) devices are required. Arranged on the channel 43G is a metal gate electrode 46G forming a Schottky barrier at the gate-channel interface. Positioned at both sides of the channel 43G, but separated from gate electrode 46G, are heavily doped $n^+$-GaAs contact regions 44S and 44D, forming source and drain regions, respectively. Source and drain electrodes 45S and 45D are deposited on their respective $n^+$-contact regions forming ohmic contacts therewith.

In FIGS. 5A through 5M, the successive steps of the process used to fabricate the MESFET 40 of FIG. 4 are illustrated in detail. The steps are listed in table that shows the correspondence between the steps and the drawings.

TABLE

| Step No. | Description of Process Step | FIG. |
|---|---|---|
| 1 | Passivation layer (42) deposition | 5A |
| 2 | Channel (43) implantation through passivation layer (42) | 5B |
| 3 | Deposition of RF-PECVD (53) and LF-PECVD (54) silicon nitride layers | 5C |
| 4 | Patterning of dummy gate structure (55) | 5D |
| 5 | Formation of T-shaped undercut profile (56) | 5E |
| 6 | $n^+$-implant to form contact (source, drain) regions (44S, 44D) | 5F |
| 7 | Ion implant annealing | |
| 8 | Formation of via holes (60S,60D) for ohmic contacts | 5G |
| 9 | Deposition of ohmic contact metallization (45), lift-off and alloying | 5H |
| 10 | Embedding in flowable dielectric (61) and planarization | 5I |
| 11 | Removal of T-shaped undercut profile (56) and formation of via holes (62) for gate contact | 5K |
| 12 | Deposition of gate metallization (46) | 5L |
| 13 | Removal of remaining mask portions (61) to obtain MESFET structure. | 5M |

While the following description is primarily directed to the fabrication of the MESFET structure shown in FIG. 4, this description is only exemplary of the inventive method. It should be noted that the thickness and other dimensions, the materials used as well as the process parameters given herein are selected for clarity of illustration and are not to be interpreted in a limiting sense. Most individual process steps that are used to evaporate, to implant, to etch, to pattern, are well known and can be performed by employing conventional equipment and techniques. They are, therefore, not explained in greater detail.

Figure 5A:
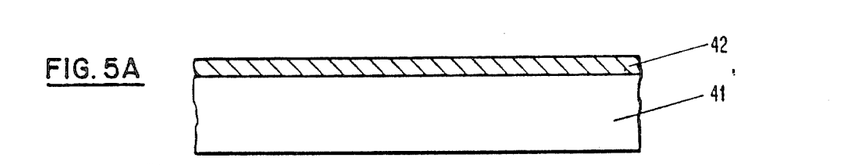

Referring now to FIG. 5A, the fabrication process is initiated starting from a semi-insulating GaAs wafer representing the substrate 41. In step 1 of the process, the substrate surface is covered with a passivation layer 42, which, in the example, consists of silicon nitride ($Si_3N_4$) of 80 nm thickness deposited in a PECVD process at a plasma excitation frequency (LF) of 50 kHz. This dielectric layer, the use of which is optional, permits through-implant of ions into the underlying semiconductor substrate 41.

Figure 5B:
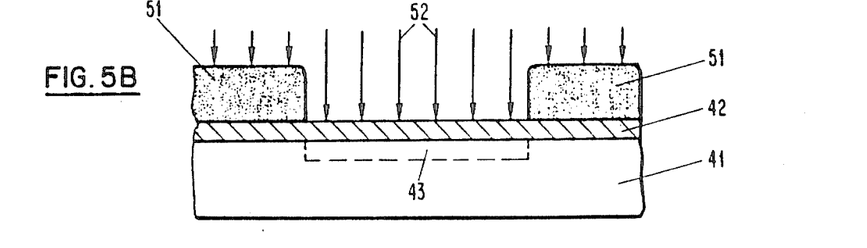

Next, photoresist 51 is applied and patterned as shown in FIG. 5B to define the substrate surface area where the channel 43 is to be formed. Subsequently (step 2), the wafer is subjected to an ion beam (arrows 52). The ions, after passing through passivation layer 42, are implanted in substrate 41 forming n- (or n$^-$-) channel 43. In the example, Si (29) is implanted at 80 kV, the dose being in the range of 3 to $6 \times 10^{12} cm^{-2}$, depending on whether a D- or E-type device is being fabricated.

Figure 5C:
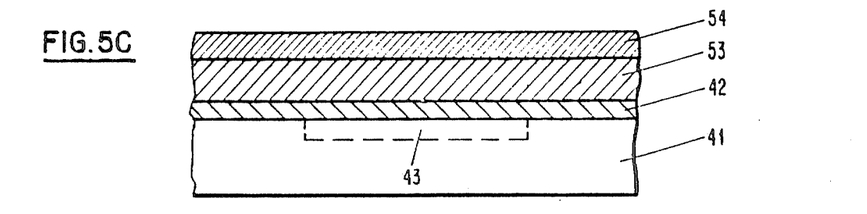

After stripping photoresist 51, two further silicon nitride layers 53 and 54 are deposited on top of passivation layer 42, as illustrated in FIG. 5C (step 3). Both layers, 53 and 54, are deposited using a PECVD tool—the lower layer 53 at a plasma excitation frequency of 13 MHz, the upper layer 54 at a frequency of 50 kHz. The process is the same as that described in connection with FIG. 1A, i.e., layer 53 is made 400 nm thick, layer 54 300 nm. As explained in more detail above, the etch-rates of the $Si_3N_4$ layers differ substantially. This effect will be used in the further process (step 5) to produce a T-shaped undercut profile.

Figure 5D:
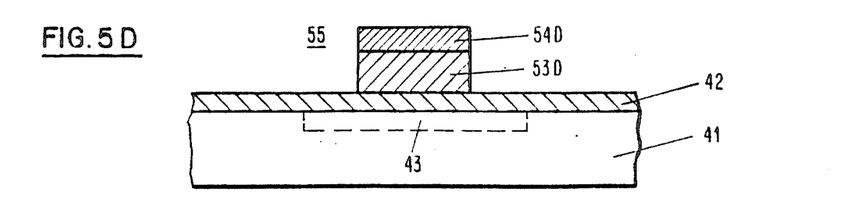

In the following step 4, reference is now made to FIG. 5D, a dummy gate structure 55 consisting of layer portions 53D and 54D is patterned from layers 53 and 54 using photoresist lithography and an reactive ion etch process (RIE). The low etch-rate $Si_3N_4$ passivation layer 42 (since deposited in a PECVD process at low excitation frequency) serves as an etch stop.

Figure 5E:
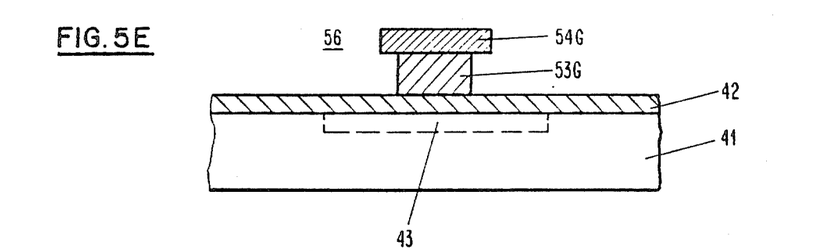

Subsequently, in step 5, a T-shaped undercut profile 56 is obtained in a BHF wet chemical etch process. Since the RF-PECVD $Si_3N_4$ film 53 G has an etch-rate about 20 times higher than that of the LF-PECVD $Si_3N_4$ film 54G, the undercut profile 56 is formed as illustrated in FIG. 5E. With an etch time of 6 minutes, an undercut of 0.25 $\mu$m is obtained.

Figure 5F:
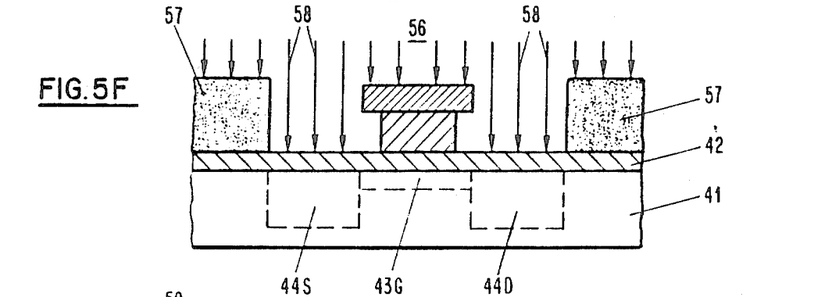

FIG. 5F illustrates step 6, i.e., the n$^+$ ion implant (arrows 58) to form the source and drain contact regions 44S and 44D, respectively. After applying and patterning photoresist 57, the Si (58) implant is again through the $Si_3N_4$ passivation layer 42, the implant dose is $5 \times 10^{13} cm^{-2}$ at 130 keV. The channel region 43G is shielded by the T-shaped dummy gate structure 56 to which the implant is self-aligned.

Subsequently, in step 7, photoresist 57 is stripped using acetone, and the ion implants annealed in a forming gas ($N_2/H_2$) at 850° C. for 20 minutes. The annealing takes place with the substrate surface protected by the $Si_3N_4$ passivation layer 42 and prior to the deposition of the gate metallization.

Figure 5G:
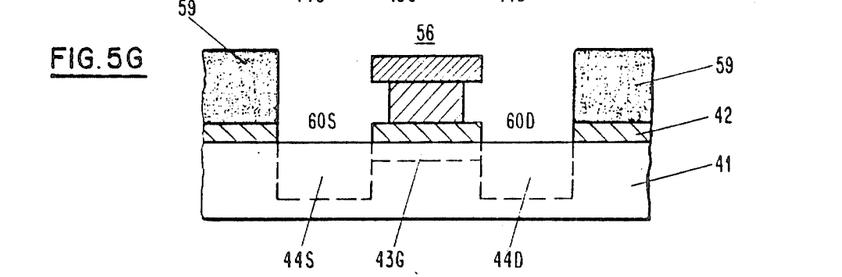

In the next step 8, those substrate surface areas, 60S and 60D, are defined where the source and drain electrodes forming ohmic contacts with the n$^+$-contact regions 44S and 44D are to be deposited. First, photoresist 59 is applied and patterned as shown in FIG. 5G. Thereafter, via holes for the ohmic contacts are etched into $Si_3N_4$ passivation layer 42, the patterned photoresist 59 and the T-structure 56 serving as mask. A RIE ($CF_4$) process is used for this purpose. The remaining photoresist 59 is then stripped.

Figure 5H:
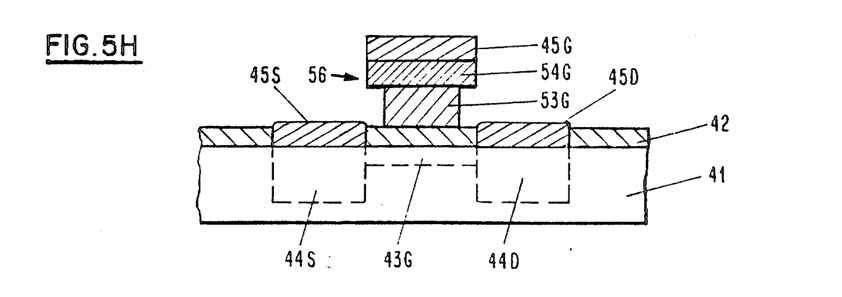
Figure 5I:
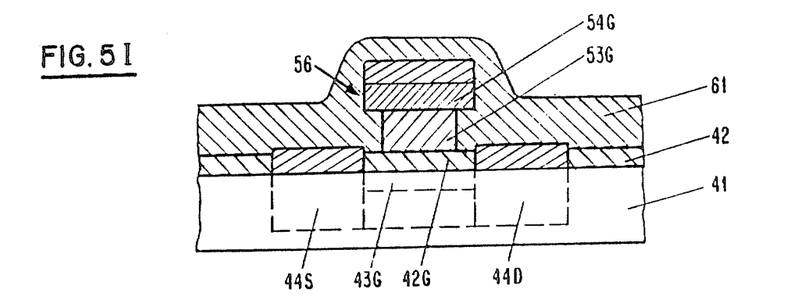

In step 9 of the process, the ohmic contact metallization, in the example consisting of an AuGeNiAu layer of 80 nm thickness, is evaporated using a photoresist mask not shown in the drawing of FIG. 5H. This metallization is deposited onto the planar surfaces, forming sections 45S, 45G, 45D and a layer, not shown in the illustration, on the photoresist. Contacts 45S and 45D are self-aligned to the dummy gate 56. After removal of the photoresist, the contacts are alloyed at 430° C. for 30 seconds.

In the following step 10, the structure so far obtained is embedded in a spun-on polyimide 61 which is then heated to 200° C. Due to reflow-planarization, the polyimide takes the form illustrated in FIG. 5I.

Figure 5K:
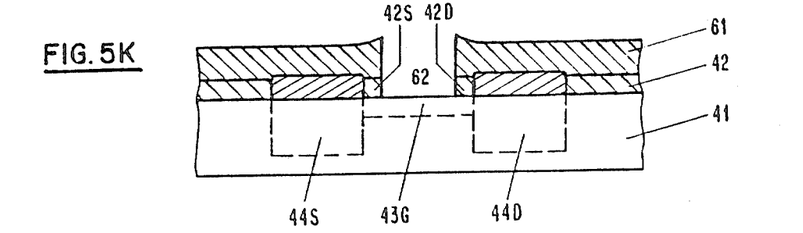

This is followed by step 11, in which the T-shaped dummy gate 56 is removed in two stages. First, the polyimide 61 on top of structure 56 and the LF-PECVD $Si_3N_4$ "top" 54G of the T-structure are etched in a RIE process, the etch being stopped at the RF-PECVD $Si_3N_4$ film 53G. Then, a via hole 62 for the gate contact is opened by etching the $Si_3N_4$ films 53G and 42G (the gate section of passivation layer 42) using plasma etching in a $CF_4$ atmosphere. The resulting structure is shown in FIG. 5K.

Figure 5L:
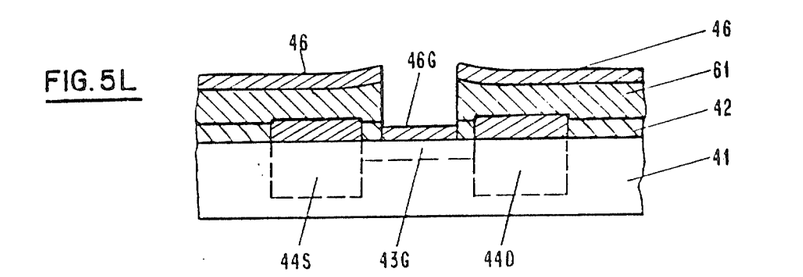
Figure 5M:
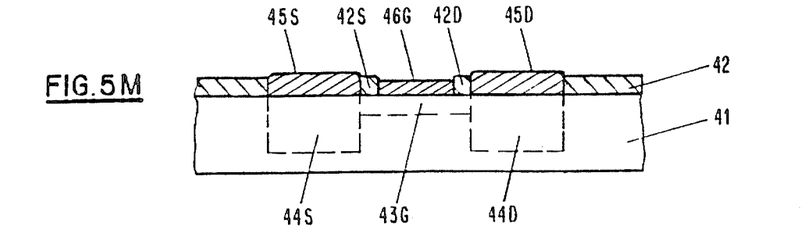

Next, in step 12, the gate metallization, in the example consisting of a titanium-platinum-gold (TiPtAu) layer 46 of 100 nm thickness, is evaporated. The metallization forms the gate contact 46G, and covers the remaining polyimide layer 61 as illustrated in FIG. 5L. Gate contact 46G is self-aligned to both, the ohmic contacts 45S and 45D and to the n$^+$-contact regions 44S and 44D.

In a final step 13, the remaining polyimide layer 61 and the metallization 46 on top of it are removed in a lift-off process. This results in the MESFET structure of FIG. 5M which corresponds to that of FIG. 4 except for the thin $Si_3N_4$ insulations 42S and 42D that separate the gate electrode 46G from the source and drain electrodes 45S and 45D, respectively. These may or may not be removed before completing the integrated circuit structure, i.e., before adding further insulations and metallizations.

From the above process description, the importance of the T-shaped undercut profile is apparent. The "top" 54G of the T is used as a mask for the n$^+$-implantation forming contact regions 44S and 44D, and for the ohmic contacts 45S and 45D whereas the "footprint" of the T, i.e., via hole 62, defines the area of the gate contact 46G. The undercut determines the critical lateral distances between the gate electrode and both the n$^+$-contact regions and the source and drain electrodes. Since the undercut can be precisely controlled in the process of the present invention, the critical distances can be accurately defined even in the sub-micron range—a prerequisite for high performance MESFET devices.

The above disclosed MESFET fabrication process offers, beside its simplicity, the important advantage that all critical MESFET parts, namely contact implantation, ohmic contact evaporation and gate metallization, are self-aligned. This, together with a sub-micron dimensions achieved through the described dummy gate process, permits a fabrication of high density, ultra-fast semiconductor devices that are well suited for modern IC techniques such as VLSI.

Having thus described our invention, what we claim as new, and desire to secure by Letters Patent is:

1. A process for fabricating undercut mask profiles for use in semiconductor device manufacturing comprising the steps of:
   depositing a first layer of dielectric material on the surface of a substrate in a plasma enhanced chemical vapor deposition reactor at a first plasma excitation frequency to impart a given etch rate to said first layer,
   depositing a second layer of dielectric material on said first layer at a second plasma excitation frequency to impart an etch rate lower than said given etch rate to said second layer,
   patterning said first and second layers such that at least one vertical edge of each of said layers is exposed, and
   etching said first and second layers at said at least one vertical edge to remove portions of said first layer at a rate higher than the rate at which portions of said second layer are removed.

2. A process according to claim 1 wherein said first and second layers of dielectric material are nitrides.

3. A process according to claim 1 wherein said substrate is made of a semiconductor material.

4. A process according to claim 1 wherein said first and second layers of dielectric material are made of silicon nitride.

5. A process according to claim 1 wherein said first and second layers of dielectric material are made of boron nitride.

6. A process according to claim 1 wherein said first and second layers of dielectric material are made of nitrides selected from the group consisting of silicon and boron nitride.

7. A process according to claim 1 wherein said first plasma excitation frequency is in a range of 1 to 50 MHz and said second excitation frequency is below 100 kHz.

8. A process according to claim 1 wherein said substrate is made of silicon.

9. A process according to claim 1 wherein said substrate is made of gallium-arsenide.

10. A process according to claim 1 wherein the step of depositing a first layer of dielectric material includes the steps of:
    introducing into said reactor a gas comprising $NH_3:N_2:SiH_4$ in the proportions 18:3:55, respectively, at a pressure of about 0.1 Pa,
    heating said substrate to a temperature of 300° C., and
    exciting said gas at a frequency of 13 MHz and a power of 75 watts to deposit a layer of silicon nitride at a rate of 20–30 nm/min. on said substrate.

11. A process according to claim 1 wherein the step of depositing a second layer of dielectric material includes the steps of:
    introducing into said reactor a gas comprising $N_2:SiH_4$ in the proportions 4:50, respectively, at a pressure of about 0.1 Pa,
    heating said substrate to a temperature of 300° C., and
    exciting said gas at a frequency of 50 kHz and a power of 75 watts to deposit a layer of silicon nitride at a rate of 20–30 nm/min. on said first layer.

12. A process according to claim 1 wherein the step of patterning said first and second layers includes the steps of:
    forming a photoresist mask on the surface of said second layer, and
    etching said first and second layers to remove portions of said layers not covered by said mask.

13. A process according to claim 1 wherein the step of etching said first and second layers includes the step of exposing said at least one vertical edge of said first and second layers to a wet chemical etch so that portions of said first layer are removed at a higher rate than portions of said second layer.

14. A process according to claim 1 wherein the step of etching said first and second layers includes the steps of exposing said at least one vertical edge of said first and second layers to a dry plasma etch so that portions of said first layer are removed at a higher rate than portions of said second layer.

15. A process for fabricating undercut mask profiles for use in the fabricating of a fully self-aligned field effect transistor which includes a gate and source and drain elements formed in a semiconductor substrate having a current channel disposed therebetween comprising the steps of:
    depositing a first layer of nitride on the surface of said substrate in a plasma enhanced chemical vapor deposition reactor at a first plasma excitation frequency to impart a given etch rate to said first layer,
    depositing a second layer of nitride on said first layer at a second plasma excitation frequency to impart an etch rate lower than said given etch rate to said second layer,
    patterning said first and second layers such that at least one vertical edge of each of said layers is exposed, and
    etching said first and second layers at said at least one vertical edge to remove portions of said first layer at a rate higher than the rate at which portions of said second layer are removed and provide an undercut mask structure having a T-shaped cross section.

16. A process according to claim 15 further including the steps of:
    ion implanting to form source and drain regions within said semiconductor substrate at both ends of said current channel using said T-shaped structure as a mask,
    depositing ohmic contact metallization onto said source and drain regions,
    applying and planarizing a reflowable dielectric to embed said T-shaped structure,
    removing the portion of said dielectric that covers the top of said T-shaped structure,
    removing said T-shaped structure to expose the surface region over said current channel where said gate electrode is to be formed,
    depositing a gate metallization, and
    removing the remaining portion of said dielectric together with those sections of said gate metallization deposited on top of it.

17. A process according to claim 15 wherein said first and second layers of nitride are made of silicon nitride.

18. A process according to claim 15 wherein said first and second layers of nitride are made of boron nitride.

19. A process according to claim 15 wherein said first and second layers of nitrides are nitrides selected from the group consisting of silicon and boron nitride.

20. A process according to claim 15 wherein said first plasma excitation frequency is in a range of 1 to 50 MHz and said second excitation frequency is below 100 kHz.

21. A process according to claim 15 wherein said semiconductor is silicon.

22. A process according to claim 15 wherein said semiconductor is galliumarsenide.

23. A process according to claim 15 wherein the step of depositing a first layer of nitride includes the steps of:
introducing into said reactor a gas comprising $NH_3:N_2:SiH_4$ in the proportions 18:3:55, respectively, at a pressure of about 0.1 Pa,
heating said substrate to a temperature of 300° C., and
exciting said gas at a frequency of 13 MHz and a power of 75 watts to deposit a layer of silicon nitride at a rate of 20-30 nm/min. on said substrate.

24. A process according to claim 15 wherein the step of depositing a second layer of nitride includes the steps of:
introducing into said reactor a gas comprising $N_2:SiH_4$ in the proportions 4:50, respectively, at a pressure of about 0.1 Pa,
heating said substrate to a temperature of 300° C., and
exciting said gas at a frequency of 50 kHz and a power of 75 watts to deposit a layer of silicon nitride at a rate of 20-30 nm/min. on said first layer.

25. A process according to claim 15 wherein the step of patterning said first and second layers includes the steps of:
forming a photoresist mask on the surface of said second layer, and
etching said first and second layers to remove portions of said layers not covered by said mask.

26. A process according to claim 15 wherein the step of etching said first and second layers includes the step of exposing said at least one vertical edge of said first and second layers to a wet chemical etch so that portions of said first layer are removed at a higher rate than portions of said second layer.

27. A process according to claim 15 wherein the step of etching said first and second layers includes the steps of exposing said at least one vertical edge of said first and second layers to a dry plasma etch so that portions of said first layer are removed at a higher rate than portions of said second layer.

28. A process according to claim 16 whrein said gate forms a Schottky barrier at an interface with said current channel.

* * * * *